(12) United States Patent
Adachi et al.

(10) Patent No.: US 6,639,765 B2
(45) Date of Patent: Oct. 28, 2003

(54) MAGNETORESISTIVE ELEMENT AND MAGNETORESISTIVE DEVICE USING THE SAME

(75) Inventors: Hideaki Adachi, Osaka (JP); Masayoshi Hiramoto, Nara (JP); Kenji Iijima, Kyoto (JP); Hiroshi Sakakima, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 204 days.

(21) Appl. No.: 09/963,895

(22) Filed: Sep. 25, 2001

(65) Prior Publication Data

US 2002/0036315 A1 Mar. 28, 2002

(30) Foreign Application Priority Data

Sep. 26, 2000 (JP) ........................................ 2000-292035

(51) Int. Cl.⁷ .............................. G11B 5/39; G11C 11/15
(52) U.S. Cl. ................ 360/324.2; 360/324.1; 365/158; 365/173
(58) Field of Search .................. 360/324, 324.1, 360/324.11, 324.2; 365/158, 171, 173; 428/692

(56) References Cited

U.S. PATENT DOCUMENTS 5,471,084 A 11/1995 Suzuki et al.
6,169,688 B1 * 1/2001 Noguchi ..................... 365/171
6,313,973 B1 * 11/2001 Fuke et al. ................ 360/324.1

FOREIGN PATENT DOCUMENTS

JP    2000-174359    6/2000

OTHER PUBLICATIONS

Article: Fabrication and properties of heteroepitaxial megnetite (Fe3O4) tunnel junkctions Authors: X. W. Li, A. Gupta, Gang Xiao, W. Qian and V. P. Dravid American Institute of Physics, Nov. 30, 1998.

* cited by examiner

Primary Examiner—David L. Ometz
(74) Attorney, Agent, or Firm—Merchant & Gould P.C.

(57) ABSTRACT

A magnetoresistive element with an improved magnetoresistive effect achieved by interposing a titanium nitride layer between a substrate and a spinel-type magnetic substance is provided. The magnetoresistive element comprises a substrate and a multilayer film formed on the substrate, and the multilayer film includes a first magnetic layer, a nonmagnetic layer formed on the first magnetic layer and a second magnetic layer formed on this nonmagnetic layer. An electric current is supplied in a direction perpendicular to a film surface of the multilayer film, and a change in electrical resistance is detected by the electric current based on a change in a relative angle between a magnetization direction of the first magnetic layer and a magnetization direction of the second magnetic layer. The first magnetic layer has a spinel crystal structure, and the multilayer film further includes a titanium nitride layer interposed between the substrate and the first magnetic layer.

12 Claims, 3 Drawing Sheets

MAGNETORESISTIVE ELEMENT AND MAGNETORESISTIVE DEVICE USING THE SAME

FIELD OF THE INVENTION

The present invention relates to a magnetoresistive element whose electrical resistance changes due to an external magnetic field and also to a magnetic device using the same, for example, a magnetic sensor used for detection of magnetic signals and a memory device used for storage of magnetic signals.

BACKGROUND OF THE INVENTION

With respect to magnetoresistive elements, an element using an anisotropic magnetoresistive (AMR) effect as well as a giant magnetoresistive (GMR) element using a change in resistance that depends on the relative angle of magnetization between magnetic layers laminated alternately via nonmagnetic layers are already in practical use. Furthermore, research has been conducted with regard to a tunnel magnetoresistive (TMR) element using the dependence of tunneling current between magnetic layers on the relative angle of magnetization. This element has a three-layer structure in which an extremely thin insulating barrier layer is interposed between two magnetic layers.

A rate of change in magnetoresistance of a TMR element depends on the spin polarizability of a magnetic material. Therefore, as spin polarizability of a magnetic substance increases, a larger rate of change can be obtained. Metal magnetic substances such as iron or cobalt have spin polarizability of about 50% at most, and this polarizability imposes a limitation with respect to the rate of change in the magnetoresistance of the element. Thus, as materials having greater spin polarizability, oxide magnetic materials containing transition metals are expected to be used. For example, perovskite structure materials such as $LaMnO_3$, particularly materials having a double perovskite structure, exhibit high spin polarizability even at room temperature. JP2000-174359A discloses a magnetoresistive element containing an oxide with a double perovskite structure.

However, there is a problem with using a perovskite structure material for operation at a high temperature, since the magnetic transition temperature is low. A double perovskite structure material does have a higher magnetic transition temperature, but it is still about 200° C., so that consideration must be given to a rise of temperature of the element at the time of operation. On the other hand, an oxide having a spinel crystal structure has a magnetic transition temperature of 400° C. or higher. As a TMR element using a spinel-type magnetic substance, a three-layer laminated tunnel junction element has been reported in which a magnetite ($Fe_3O_4$) thin film magnetic layer is used (X. W. Li et al., Applied Physics Letters, Vol. 73, No. 22, P. 3282–3284, published in 1998). However, a rate of change in magnetoresistance that can be obtained from a TMR element using a spinel-type magnetic substance conventionally stays within several percent, which is smaller than expected from the spin polarizability. The reason therefor is not known in detail, but it is considered that various properties centering the electronic state of a spinel-type magnetic layer are not sufficient, so that the spin hops at random, thereby reducing the apparent spin polarizability.

A spinel-type magnetic substance has a complicated crystal structure compared to ordinary metals or alloyed magnetic materials. Therefore, it is not easy to obtain a good-quality spinel-type magnetic layer by controlling the crystallographic, electrical and magnetic properties appropriately. In order to form a good-quality spinel-type magnetic layer, a high-precision facility and highly advanced technology are required. Furthermore, the production is complicated, and the reproducibility also is difficult. Under such circumstances, a sufficient change in magnetoresistance was not yet obtained from an element using a spinel-type magnetic substance.

SUMMARY OF THE INVENTION

Therefore, it is an object of the present invention to improve a magnetoresistive element using a spinel-type magnetic substance.

It has been found that a larger magnetoresistive effect can be obtained by interposing a titanium nitride (TiN) layer between a substrate and a spinel-type magnetic substance. In other words, a magnetoresistive element of the present invention has a substrate and a multilayer film formed on the substrate, and this multilayer film includes a first magnetic layer, a nonmagnetic layer formed on the first magnetic layer and a second magnetic layer formed on this nonmagnetic layer, the layers being laminated from a side of the substrate in this order. An electric current is supplied in a direction perpendicular to a film surface of the multilayer film, and a change in electrical resistance is detected by the electric current based on a change in a relative angle between a magnetization direction of the first magnetic layer and a magnetization direction of the second magnetic layer. The first magnetic layer has a spinel crystal structure, and the multilayer film further includes a titanium nitride layer interposed between the substrate and the first magnetic layer.

According to the present invention, it is comparatively easy to obtain an excellent junction even by using a magnetic substance having a spinel crystal structure. This excellent junction results from the interposed titanium nitride layer itself, so that there is also an advantage of not necessarily using particularly high-precision equipment for production of the element.

By using the element of the present invention, the properties of various magnetic devices such as a magnetic sensor or a magnetic memory device can be improved. One example of the magnetic sensor is a magnetoresistive effect type head.

DESCRIPTION OF THE PREFERRED EMBODIMENTS

Hereinafter, preferred embodiments of a magnetoresistive element of the present invention and a magnetic device using the same will be described with reference to the drawings.

Figure 1:
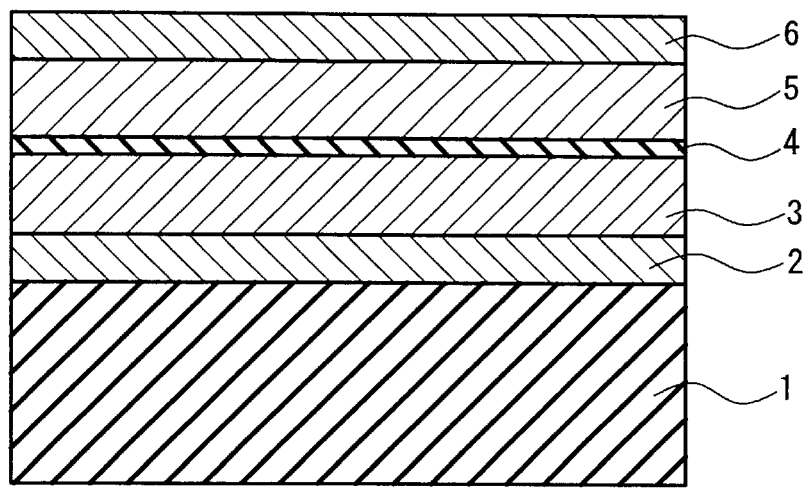
FIG. 1 is a cross-sectional view showing an example of a magnetoresistive element of the present invention.

A magnetoresistive element shown in FIG. 1 includes a substrate 1, and a titanium nitride (TiN) layer 2, a spinel-type magnetic layer (a first magnetic layer) 3, a nonmagnetic layer 4 and a second magnetic layer 5 laminated in this order on the substrate 1. An electrode 6 (an upper electrode) is disposed further on the second magnetic layer 5. An electric current provided for detection of the external magnetic field passes through both the magnetic layers and the nonmagnetic layer in a direction perpendicular to the film surface.

In this element, the titanium nitride layer is interposed over the entire area of the substrate on which the spinel-type magnetic layer is formed. When the titanium nitride layer is inserted in this manner, it was confirmed that twice or larger change in magnetoresistance can be obtained compared to the case of not providing this layer. The reason therefor is not known in detail at the present time. Titanium nitride has a rock-salt cubic structure with 4.24 Å in lattice constant, and this lattice constant corresponds to almost half of the lattice constant of a cubic structure of magnetite serving as a typical spinel-type magnetic substance, which is about 8.4 Å. However, it seems that factors other than the consistency of the crystalline lattice also may be contributing to the improvement of properties. This is because, even by using a substrate having a better matching of lattice such as magnesium oxide (lattice constant: 4.20 Å; rock-salt cubic structure), $MgAl_2O_4$ (lattice constant: 8.1 Å; spinel crystal structure) or the like, an element with approximately the same degree of high performance as the element with the titanium nitride layer interposed therebetween cannot be obtained. Overall consistency may be involved here besides the consistency of the crystalline lattice including, for example, the electrical or chemical level and the stability on the interface between the spinel magnetic layer and the titanium nitride layer. The thickness of the titanium nitride layer is not particularly limited, but a thickness of at least 50 nm is preferable to improve the magnetoresistive effect sufficiently.

Although the effect of property improvement by the titanium nitride layer can be achieved also in the case of using a magnetic substance containing chromium, nickel or manganese as the first magnetic layer 3 having a spinel crystal structure, a magnetoresistive element having excellent electrical characteristics and chemical stability can be obtained by using a ferrimagnetic oxide containing iron atoms. A material exhibiting the largest change in magnetoresistance is magnetite ($Fe_3O_4$), which is an oxide of composite valence numbers including bivalent iron and trivalent iron.

It is confirmed that the effect of property improvement by the titanium nitride layer can be achieved also in the case of using a good conductor such as copper (as a so-called CPP-GMR element) as the nonmagnetic layer 4. However, in the case of a TMR element using an insulating layer of oxide, nitride or the like as the nonmagnetic layer, the improvement in the magnetoresistive effect is remarkable.

An amorphous material such as glass or a polycrystalline ceramic material may be used as the substrate 1, but a single crystal material is suitable. When a single crystal substrate is used, the crystal orientation of titanium nitride is more likely to be aligned substantially in one direction, and as a result thereof, the crystal orientation of the spinel magnetic layer also can be affected more easily.

Silicon, sapphire or the like may be used as the single crystal substrate, but particularly excellent results can be obtained by using a single crystal of magnesium oxide. This is considered to result from the high crystallographic and chemical consistency that can be achieved simultaneously on both interfaces between the magnesium oxide substrate, the titanium nitride layer and the spinel magnetic layer. In addition, higher properties can be obtained by forming the layers on the surface of a (110) plane of a magnesium oxide single crystal, compared to the case of forming on a (111) plane or a (211) plane of the crystal. Moreover, when the surface of the substrate is set to be a (110) plane, a large rate of change in magnetoresistance can be obtained by applying an external magnetic field for changing electrical resistance along a direction inclined at an angle of not more than 45° with respect to a <110> orientation of magnesium oxide crystal. As described above, when the substrate having high consistency with titanium nitride is used and the titanium nitride layer is formed directly on this substrate, an excellent junction can be achieved with a simple configuration.

Figure 2:
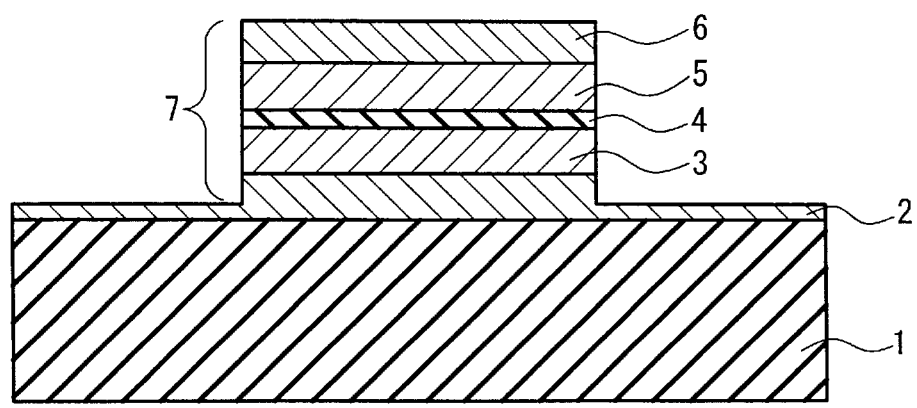
FIG. 2 is a cross-sectional view showing an example of a magnetoresistive element of the present invention.

Materials other than titanium nitride described above are all illustrative examples. Materials used for the second magnetic layer 5, the electrode 6 and the other layers also are not particularly limited, and materials used conventionally may be used. The deposition technique for forming each layer also is not particularly limited. The titanium nitride layer may be formed by any usual deposition technique, so that, for example, various types of sputtering, chemical vapor deposition (CVD) or the like can be applied. The above-mentioned element is an example of the present invention, and the element may include further layers not shown in the drawing, for example, an anti-ferromagnetic layer serving as a layer for controlling magnetization rotation of magnetic layers. According to the configuration shown in the drawing, since the titanium nitride layer is used also as the lower electrode, only the titanium nitride layer is interposed between the substrate 1 and the first magnetic layer 3. However, as long as the object of the present invention can be achieved, other layers may be inserted therebetween. The shape of the element also is not limited to the illustrative example of FIG. 1, and as shown in FIG. 2, a step portion 7 may be formed by fine processing using the photolithographic technique and used for a device. In this case, as shown in FIG. 2, a portion of the titanium nitride layer 2 serving as the electrode preferably is processed so as to be left on the substrate 1.

Figure 4:
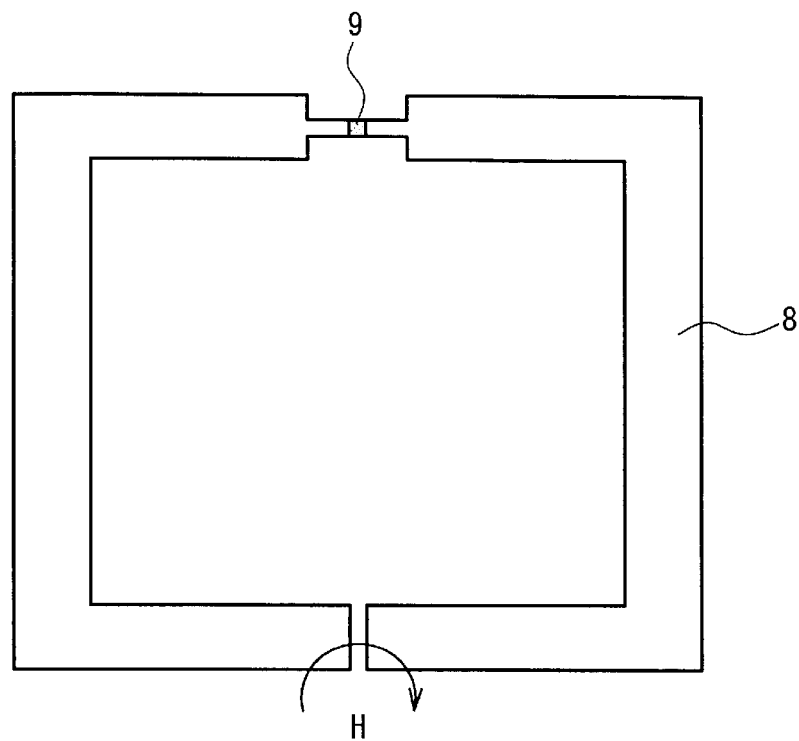
FIG. 4 is a diagram showing an example of a magnetic head using the element of the present invention.

FIG. 4 shows a magnetoresistive effect type head as an example of a magnetic sensor using the above-mentioned element. In this head, an external magnetic field H to be detected is led by a magnetoresistive element 9 via a yoke 8 that is formed with a magnetic film having high magnetic permeability. In this case, the external magnetic field may be led to the entire element, but it is preferable to lead the external magnetic field to the magnetic layers where the magnetization rotation can be achieved relatively easily. As materials for the yoke, materials used conventionally, for example, soft magnetic films of Fe—Si—Al, Ni—Fe—Co, Co—Nb—Zr, Fe—Ta—N alloys or the like may be used, and these films can be formed by applying any known deposition technique such as plating etc.

Figure 5:
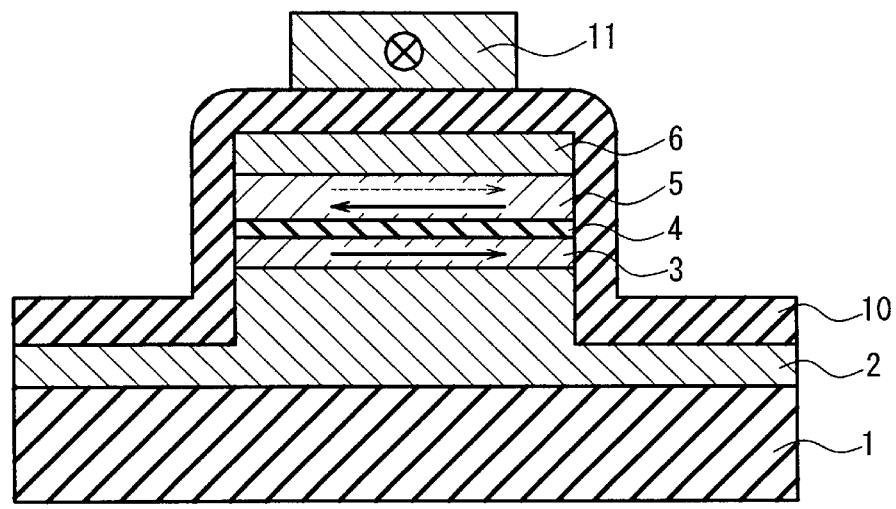
FIG. 5 is a cross-sectional view of a cell in an example of a memory device using the element of the present invention.

FIG. 5 shows an example of a cell included in a magnetic memory device using the above-mentioned element. In this element, the surface of the magnetoresistive element shown in FIG. 2 is covered with an electrical insulating layer 10, and an information recording conductive wire 11 generating a magnetic field is laminated further on this layer. In the case of this cell, for example, either the magnetization of the magnetic layer 3 or that of the magnetic layer 5, in which the magnetization direction is aligned uniformly in the initial state, is inverted by the magnetic field generated by an electric current flowing in the conductive wire 11. In the element shown illustratively in FIG. 5, the magnetization of the second magnetic layer 5 can be rotated more easily than the first magnetic layer 3, so that the second magnetic layer 5 is shown in a state in which the magnetization is inverted. In this manner, information is recorded by the inversion of the magnetization in one of the magnetic layers. In the case of this element, information is read by detecting a change in resistance between the titanium nitride layer 2 and the lead-out electrode 6. In addition, materials for the conductor 11 are not particularly limited, and low-resistivity metal wires of Al, Au, Cu, Ag or the like can be used.

The configuration and the operation of the device described above are only illustrative, and the element of the present invention can be applied to magnetic devices of various configurations. The operation of the device, for example, the operation of the memory described above, also is only an example.

EXAMPLES

Example 1

A magnetoresistive element with the same configuration as the element shown in FIG. 1 was produced by using a magnetite ($Fe_3O_4$) magnetic thin film, which is a ferrimagnetic substance having an inverse-spinel crystal structure. A substrate used was a silicon substrate covered with a silicon oxide (thermally oxidized film) in an amorphous state. A titanium nitride (TiN) film of 100 nm in thickness was formed on this substrate by sputtering in a mixed atmosphere of argon/nitrogen using titanium metal as the target. Here, a temperature of the substrate at the time of forming the TiN film was set to be 500° C. Next, a magnetite magnetic thin film layer of 50 nm in thickness was formed. Furthermore, after a sputtering film of aluminum was deposited with a thickness of 2 nm, this film was oxidized so as to form an aluminum oxide film as an insulating layer. Subsequently, a CoFe ferromagnetic layer 20 nm in thickness was formed. Finally, a gold electrode was provided as a lead-out electrode.

The dependence of resistance (resistance between TiN and the gold electrode) on the external magnetic field in the thus obtained element was measured. As a result thereof, a change in resistance of about 4% was observed. On the other hand, an element produced in the same manner as described above without using the TiN layer exhibited a change in resistance of not more than 1%.

In the case of reversing the order of laminating the above-mentioned layers, and as a result thereof, when the TiN layer was formed on the second magnetic layer of magnetite, the property was improved, but this effect was not the extent seen when the TiN layer was formed between the substrate and the magnetic film.

Example 2

Other than using a single crystal substrate of magnesium oxide (MgO) as the substrate, a magnetoresistive element was produced in the same manner as in Example 1. The face of the substrate was formed as a (100) plane. When a temperature of the substrate was raised to 300° C. or higher while forming a TiN layer, a thin film of TiN whose <100> axis was oriented perpendicular to the surface of the substrate could be obtained. On the other hand, when the temperature of the substrate was in a range of room temperature to about 200° C., the TiN layer formed had a polycrystalline structure. Both of the TiN layers presented a color of gold and were good conductors having an electric resistivity of not more than 0.02 mΩ·cm. The magnetoresistive properties of these elements were evaluated. As a result thereof, the element containing the polycrystalline TiN layer exhibited a rate of change in magnetoresistance of 5%, while a change in magnetoresistance of 10% could be obtained from the element containing the TiN layer of the <100> orientation.

Also in the case of using a ferrimagnetic layer of $MnFe_2O_4$, $CoFe_2O_4$ or the like as the spinel magnetic layer, it was possible to produce an element exhibiting a change in magnetoresistance of about 8%. On the other hand, in the case of producing an element in which an oriented film of platinum (Pt) serving as a good conductor was inserted instead of the TiN layer, the rate of change in magnetoresistance was as small as 2%.

Example 3

A magnetoresistive element with the same configuration as the element shown in FIG. 2 was produced by using MgO having a surface of (100), (110) or (111) plane orientation as the substrate. First, the substrate was heated to a temperature of 400° C. to form a TiN layer 300 nm in thickness, and subsequently, a $Fe_3O_4$ magnetic layer 50 nm in thickness, an aluminum oxide insulating layer 1 nm in thickness, a CoFe magnetic layer 20 nm in thickness and a copper electrode layer 100 nm in thickness were laminated sequentially. During this process of lamination, it was confirmed that depending on the surface of the substrate used, the TiN layer had its <100>, <110> or <111> axis respectively oriented perpendicular to the substrate, and that the $Fe_3O_4$ magnetic layer also had the same orientational property as the TiN layer. This element was processed by fine processing using photo-process and ion etching into a mesa element provided with a step. The mesa was patterned as a square with each side having a length of 10000 nm.

Figure 3A:
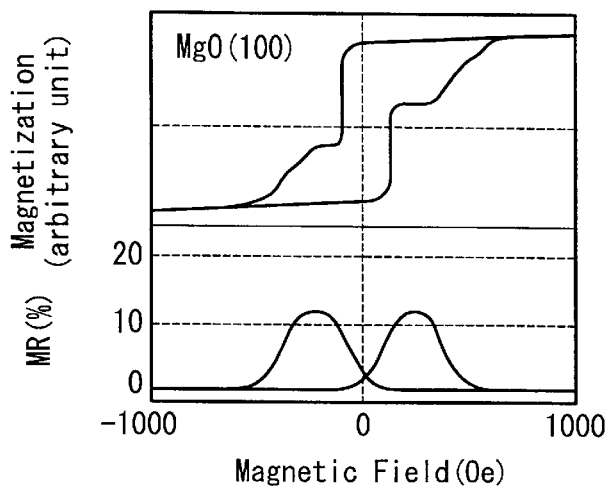
FIG. 3A, FIG. 3B and FIG. 3C are graphs showing the magnetic properties and the magnetoresistive properties in an example of a magnetoresistive element of the present invention.
Figure 3B:
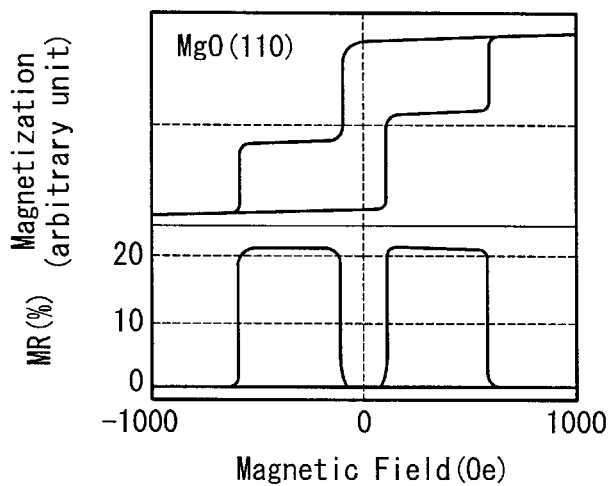
Figure 3C:
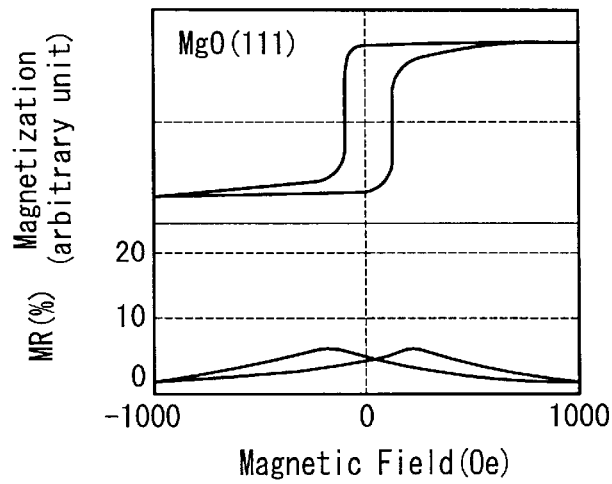

With respect to each of the thus obtained elements, a change in magnetoresistance was detected by an electric current flowing between TiN and the copper electrode. The results are shown in FIG. 3A, FIG. 3B and FIG. 3C. A rate of change in magnetoresistance of about 12% could be obtained by using the MgO (100) plane, and a rate of change in magnetoresistance of 6% could be obtained by using the MgO (111) plane. However, when the MgO (110) plane was used, the rate of change in magnetoresistance exceeded 20%. Furthermore, when the external magnetic field was applied along the <110> orientation parallel to the surface of the MgO substrate, the rate of change in magnetoresistance reached its maximum.

Example 4

In the present example, a difference in the rate of change in magnetoresistance according to the type of the nonmagnetic layer was measured. A MgO (110) plane was used as the substrate, and a TiN layer (300 nm), a lower $Fe_3O_4$ magnetic layer (10 nm), an insulating layer (2 nm) and an upper $Fe_3O_4$ magnetic layer (20 nm) were formed sequentially on the substrate. Here, the thicknesses of the layers are shown in parentheses. When the TiN layer was formed, the substrate was heated to 400° C. Furthermore, as an antiferromagnetic layer for fixing the magnetization of the upper $Fe_3O_4$ magnetic layer, a $LaFeO_3$ layer 50 nm in thickness was laminated, and finally, a gold lead-out electrode 100 nm in thickness was formed from the upper $Fe_3O_4$ magnetic layer.

As the insulating layer, aluminum oxide, tantalum oxide, titanium oxide, magnesium oxide, ceric oxide, strontium titanate, aluminum nitride respectively were used. By applying a magnetic field in the <110> direction of MgO, changes in magnetoresistance were measured. The measured values were 10% or less for tantalum oxide, magnesium oxide and aluminum nitride, about 15% for titanium oxide and ceric oxide, about 20% for aluminum oxide, and 25% for strontium titanate. The reason why the magnetoresistive effect is dependent on the material of the insulating barrier layer is not clear, but atoms of the barrier may affect the electronic state of the magnetic layer.

Example 5

A magnetic head with the same configuration as that shown in FIG. 4 was produced by using an element including a strontium titanate insulating layer formed in Example 4. In the case of this magnetic head, the yoke and the element were positioned such that a magnetic field led by the yoke is applied in a direction inclined at an angle of 30 degrees from the <110> orientation of the MgO (100) substrate in order to achieve excellent sensitivity to an extremely weak magnetic field in the vicinity of the zero field. The material used for the yoke was a CoNbZr amorphous alloy film. In the case of a magnetic head, by adding the yoke arranged as described above, the sensitivity to the external magnetic field of 10 Oe (approximately 796 A/m) improved to at least twice as much.

Example 6

A magnetic memory provided with a cell shown in FIG. 5 was produced. A (110) plane of MgO was used as the substrate, and a TiN layer (800 nm), a $(Fe, Co)_3O_4$ magnetic layer (20 nm), a titanium oxide insulating layer (1 nm), a CoFe magnetic layer (5 nm) and a copper electrode layer (100 nm) were laminated sequentially on the substrate (thicknesses of the layers are shown in parentheses). Next, each layer was processed by fine processing into a mesa pattern with a size of 5000 nm×2000 nm, and the entire surface was coated with a $SiO_2$ insulating film (300 nm). An information recording conductive wire made of Al was wired on this insulating film to complete the memory cell.

Information was recorded and reproduced by using this memory cell. First, a pulse current was supplied to the information recording conductive wire to generate a magnetic field of 100 Oe (about 7960 A/m) so that the orientations of both the magnetic layers were aligned uniformly. Next, a pulse current was supplied in the reverse direction to generate a magnetic field of −50 Oe (about −398 A/m) so that only the magnetization of the upper magnetic layer (the CoFe magnetic layer) was inverted. In this condition, a voltage was applied between the TiN layer and the copper electrode, and a change in resistance between the both electrodes was observed. As a result, an apparent change in resistance could be measured.

As described above, according to the present invention, a magnetoresistive element using a spinel magnetic material with high spin polarizability that exhibits a large magnetoresistive effect can be provided. This element can be produced easily as well. Due to the fact that the present invention enables easier mass production of a magnetic sensor or a magnetoresistive effect type memory device with excellent properties, the present invention is extremely valuable for use in the technical field concerned.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A magnetoresistive element comprising a substrate and a multilayer film formed on the substrate, the multilayer film including a first magnetic layer, a nonmagnetic layer formed on the first magnetic layer and a second magnetic layer formed on the nonmagnetic layer, the layers being laminated from a side of the substrate in this order, an electric current being supplied in a direction perpendicular to a film surface of the multilayer film, and a change in electrical resistance being detected by the electric current based on a change in a relative angle between a magnetization direction of the first magnetic layer and a magnetization direction of the second magnetic layer, wherein the first magnetic layer has a spinel crystal structure, and the multilayer film further includes a titanium nitride layer interposed between the substrate and the first magnetic layer.

2. The magnetoresistive element according to claim 1, wherein the nonmagnetic layer is an electrical insulating layer.

3. The magnetoresistive element according to claim 1, wherein the first magnetic layer comprises a ferrimagnetic oxide containing iron.

4. The magnetoresistive element according to claim 3, wherein the ferrimagnetic oxide is magnetite ($Fe_3O_4$).

5. The magnetoresistive element according to claim 1, wherein the titanium nitride layer is formed directly on the substrate.

6. The magnetoresistive element according to claim 1, wherein a crystal orientation of titanium nitride crystals in the titanium nitride layer is aligned substantially in one direction.

7. The magnetoresistive element according to claim 1, wherein the substrate is a single crystal.

8. The magnetoresistive element according to claim 7, wherein the single crystal is a single crystal of magnesium oxide.

9. The magnetoresistive element according to claim 8, wherein a surface of the substrate is a (110) plane of the single crystal of magnesium oxide.

10. The magnetoresistive element according to claim 9, wherein an external magnetic field for changing electrical resistance is applied along a direction inclined at an angle of not more than 45° with respect to a <110> orientation of the single crystal of magnesium oxide.

11. A magnetic sensor comprising the magnetoresistive element according to claim 1, wherein magnetic signals are detected by using the element.

12. A magnetic memory device comprising the magnetoresistive element according to claim 1, wherein magnetic signals are stored in the element.

* * * * *